METHOD OF ELECTROPLATING DISCRETE CONDUCTIVE REGIONS

Filed Dec. 10, 1970

INVENTORS
M. A. DE ANGELO
D. J. SHARP
By J. Rosenstock
ATTORNEY

United States Patent Office 3,729,389

Patented Apr. 24, 1973

3,729,389

METHOD OF ELECTROPLATING DISCRETE CONDUCTIVE REGIONS

Michael Anthony De Angelo, Hamilton Township, Mercer County, and Donald Jex Sharp, Lawrence Township, Mercer County, N.J., assignors to Western Electric Company, Incorporated, New York, N.Y.

Filed Dec. 10, 1970, Ser. No. 96,946
Int. Cl. C23b *5/48, 5/58;* B01k *3/04*
U.S. Cl. 204—15 34 Claims

ABSTRACT OF THE DISCLOSURE

A method of electrodepositing a metal coating on discrete conductive portions is described. The method comprises immersing the discrete conductive portions in a standard metal plating bath containing a suitable anode. The discrete portions are then contacted with a cathode fabricated of a valve metal material, which material is capable of functioning as an electrode but which is passive to metal deposition upon its own surfaces. A current density is then maintained within the plating solution which is sufficient to metal plate the discrete portions to a desired thickness.

BACKGROUND OF THE INVENTION

(1) Field of the invention

This invention relates to a method of electroplating conductive regions, and more particularly to electroplating discrete, noncontinuous and separated conductive patterns delineated upon an insulating base.

(2) Description of the prior art

The deposition of metallic coatings on conductive surfaces is often affected by electroplating. Electroplating techniques are employed to build up metallic patterns on insulating bases, i.e., printed circuits. Specifically, such circuits are often made by first generating thin conductive patterns with an electroless plating step. The electroless plating is terminated when a sufficient thickness of the pattern, capable of carrying electroplating currents, results. Electroplating is then used to build up the thin electroless pattern.

When the patterns on the bases are electrically continuous, electroplating is rather simply effected. However, where a plurality of isolated discrete conductive patterns reside on a base, difficulty is experienced in simultaneously electroplating upon all of these discrete pattern.

Various techiques employing through-holes, i.e., holes whose walls are metal coated and which join together discrete patterns on opposite sides of a base, if they are so disposed, interconnections between discrete patterns, which are destined to be later etched away, and a multiplicity of leads to the various discrete patterns are employed to connect all the discrete patterns to a cathode during the electrodeposition. However, as is evident, these techniques are tedious, time consuming, add operational steps and are, therefore, costly.

To partially obivate the above-enumerated difficulties, techniques were developed wherein a stainless steel drum or roller is employed as a cathode in an electrolyte. A flexible printed circuit base or substrate, containing various discrete thin metallic patterns is then fed around the stainless steel cathode drum or roller. The feeding of the printed circuit base around the drum causes portions of the discrete patterns to be contacted by the drum, thereby achieving electroplating upon the plurality of discrete patterns.

However, an inherent problem resides in the use of the stainless steel drum cathode, for there is plating thereupon of the electroplated metal. The plated metal is not adherent to the stainless steel drum cathode and is easily removed therefrom. If the coating on the drum need be removed, another step is added. At times, the coating falls by itself from the drum, which deleteriously affects the coating being electroplated upon the patterns. For example, if through-holes are employed, the easily parted coating clogs these through-holes. This clogging often results in discontinuities in the build-up of electroplated metal coating.

In British Pat. No. 867,560, issued May 10, 1969, a modified barrel plating procedure is employed to simultaneously electroplate discrete patterns contained on an insulating base or substrate. The procedure employs a series of nickel or stainless steel spheres which cover a portion of the surface of the base to contact a plurality of the discrete patterns as well as each other. The spheres and the base, in turn, are housed in a barrel or container which contains an anode and an electrolytic plating solution. The series of spheres is contacted with the negative pole of a voltage source and, therefore, the series of spheres collectively represents the cathode of the electroplating system.

The barrel is rotated, whereby the series of spheres, in intimate contact with each other, contact at least periodically each discrete pattern. Such contact results in an electroplated build-up on the discrete patterns.

The problem involved in this modified barrel plating procedure is that the plated metal is plated upon the cathode spheres. The adhesion of the plated metal to the spheres is poor and through a rolling or rotating action of the spheres on the substrate, the plated metal on the spheres flakes off and becomes pulverized into a powder. Here again, the pulverized or powdered metal interferes with the electroplated metal build-up, or clogs the through-holes which are employed to plate both sides of the substrate, thereby leading to discontinuos plating.

SUMMARY OF THE INVENTION

The present invention is directed to a method of electroplating conductive configurations or regions, and more particularly to electroplating discrete, noncontinuous and separated conductive patterns delineated upon an insulating base.

The method includes first selecting a suitable electroplating bath. The discrete configuration or regions, either individually contained or collectively supported on an insulative base, i.e., as a printed circuit, are immersed in the electroplating bath. A suitable anode is selected and inserted in the electroplating bath. The discrete regions, when immersed in the bath, are contacted therein by a cathode comprising a material capable of conducting the electrical current needed for electrodeposition, but which is passive to electrodeposition, i.e., the metallic species to be plated does not plate out on the material of the cathode. Such a suitable material has been found to be a valve metal selected from the group consisting of tantalum, niobium, molybdenum and tungsten. Upon insertion of the discrete regions into the solution and upon contact with the valve metal cathode, a sufficient current density is maintained within the bath whereby the discrete conductive portions or regions are plated and built up.

The method is one which optimizes the build-up by (1) eliminating the necessity for a multiplicity of cathodic leads to each discrete region, (2) eliminating the necessity for interconnections between each conductive region, which interconnections are destined for subsequent removal and (3) contacting each conductive region, during electrodeposition with a cathodic material which conducts electricity but which is passivated from the electrodeposition upon its own surfaces, i.e., there is no metal plating thereupon under the electroplating conditions employed.

DESCRIPTION OF THE DRAWINGS

The present invention will be more readily understood by reference to the following drawing taken in conjunction with the detailed description, wherein.

DETAILED DESCRIPTION

The present invention is described primarily in terms of the electrodeposition of metallic copper employing tantalum, niobium, molybdenum and tungsten cathodes. However, it will be understood that such description is exemplary only and is for purposes of exposition and not for purposes of limitation. It will be readily appreciated that the inventive concept described is equally applicable to the valve metal cathodes which are chemically compatible, i.e., do not undergo chemical interaction, with a particular electrolytic plating solution to be employed to achieve the electrodeposition of a particular metal desired, which metal is not limited to copper alone.

Figures 1, 2A, 2B:
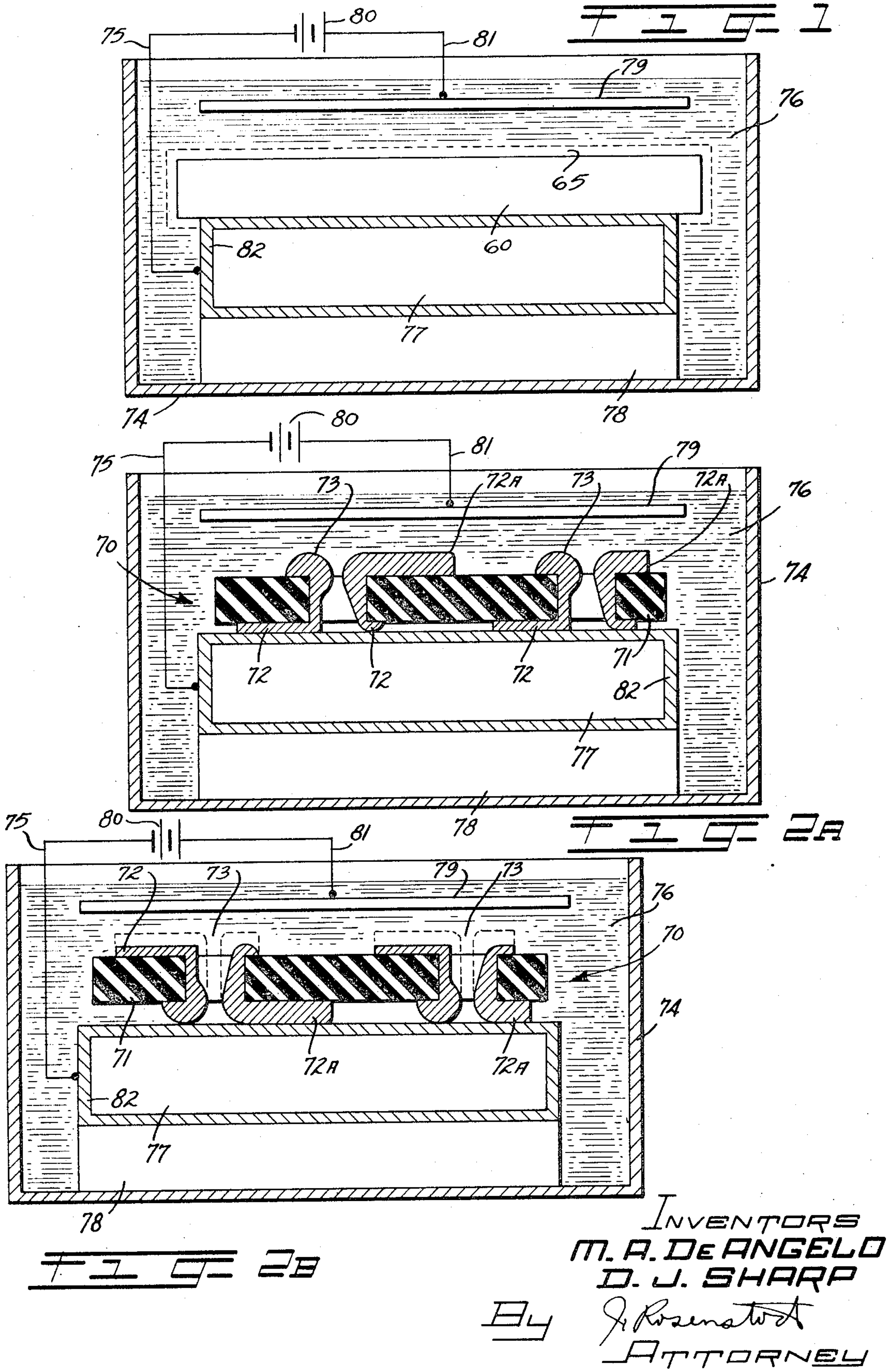
FIG. 1 is a cross-sectional view of a general embodiment of a plating apparatus for effecting the novel method of this invention during electrodeposition of a metal upon a conductive substrate.
FIG. 2A is a cross-sectional view of the plating apparatus of FIG. 1 during an initial metal plating build-up of a plurality of discrete conductive portions supported on an insulative base.
FIG. 2B in a cross-sectional view of the plating apparatus of FIG. 2A after the final metal plating build-up of the discrete conductive portions.

With reference now to FIG. 1, there is shown a suitable substrate 60. A suitable substrate 60 is any material capable of conducting an electrical current. To deposit a metallic layer or coat 65 on substrate 60, the substrate 60 is destined to be subjected to an electroplating treatment. A suitable inert, insulative container 74 is selected. A suitable container 74 is one which will not react with the electroplating bath reagents destined to be contained therein. Contained within container 74 is a metal electroplating solution 76, such as, for example, a standard copper acid sulfate, acid fluoroborate, alkaline cyanide or alkaline Rochelle cyanide solution.

It should be noted that the electroplating solution selected depends upon the metal desired to be plated out, the compatibility of the plating solution with the substrate 60 and the compatibility of the plating solution with the particular valve metal containing material destined to be employed as a cathode. The above requirements are those which are well known or can be easily ascertained through experimentation by those skilled in the electrochemical art.

Housed within container 74 is a suitable cathode 77, which may be supported on an inert pedestal 78, and which is connected by a suitable means 75 to the negative pole of a voltage source 80, e.g., a battery. A suitable cathode is one comprising a material, e.g., tantalum, which conducts electricity but which is inert or passivated towards the electroplating action of the plating solution

76, i.e., the material does not become metal plated under the conditions employed for electroplating the metal, e.g., copper, onto the substrate 60 from solution 76.

Suitable materials other than tantalum have been found to be niobium, molybdenum and tungsten which are metals selected from the group of metals known as the valve metals. The term valve metal denotes a group of metals, as described by L. Young, Anodic Oxide Films, Academic Press Inc., 1961 at p. 4, having as a fundamental characteristic property the tendency to form a protective high-electrical resistance oxide film on anodic polarization to the exclusion of all other electrode processes. In general, any metal can be employed and classified as a valve metal which forms oxide films, on its surface, which behave quite analogously to those formed on tantalum.

The valve metals selected are those metals which (1) are capable of forming protective oxides of good electrical integrity, i.e., are those valve metals which form good resistors, (2) are chemically compatible with the particular plating solutions to be employed, i.e., the valve metals and/or their oxides are not soluble to any great extent in the plating medium and (3) have oxides which are self-regenerating, i.e., are those valve metals which will spontaneously form oxides when exposed to air or oxygen.

It is to be understood that any valve metal meeting the above criteria may be employed. It is also to be understood that a combination of the designated valve metals, e.g., an alloy thereof, may be employed as the cathode material. It is finally to be understood that a combination of at least one suitable valve metal i.e., tantalum, niobium, molybdenum, and tungsten and at least one other selected metal can be combined, e.g., in alloy form, and employed as the cathode material. Preferably, the valve metal group is a major constituent of the combination or alloy, i.e., there is at least 30 weight perecnt of the valve metal present, depending on the metal type. In this regard, selected metals are those metals which are (1) chemically compatible with the selected valve metals and (2) chemically compatible with the electrolytic plating solution employed.

It is to be noted at this point, that it has been known to be quite difficult to electroplate a valve group metal, e.g., tantalum. It is surprising, however, to find that one can metal plate a conductive substrate, e.g., copper, in contact with a valve metal without having electrodeposition upon the valve metal.

Immersed in solution 76 is a suitable anode 79, e.g., a copper anode, which is connected by a suitable means 81 to the positive pole of the voltage source 80. The substrate 60 is immersed in the plating solution 76 and lowered therein until contact is made with the valve metal cathode 77, e.g., tantalum. A sufficient current density is maintained within solution 76 whereby the metal, e.g., copper, is electroplated on the substrate 60 to form the metallic layer 65 having a desired thickness. For a tantalum cathode, employed in the electrodeposition of copper, the maximum current density which can be employed without observing passivation breakdown, i.e., the breakdown of the resistance of the tantalum cathode to electrodeposition upon its surface, with resultant copper plating thereupon, has been found to be 250 amps per square foot of the surface area of the substrate to be deposited upon.

In FIG. 1, a cross section of the valve metal cathode 77 is shown. A desirable valve metal, e.g., tantalum, niobium, etc. naturally occurring, has an oxide film 82 which covers its surface areas. This naturally occurring oxide film 82 ranges from 5 to 20 A. in thickness for tantalum at 25° C. It is hypothesized that this oxide film passivates the cathode, i.e., prevents it from becoming plated while functioning as the cathode during electrodeposition. Therefore, for the particular valve metal employed as the cathode 77, the plating bath 76 selected should be one which will not attack this oxide coating 82 and thereby lead to deposition on the cathode 77 resulting in the possible sequential metal flaking, pulverizing and through-hole plugging previously encountered with stainless steel and/nickel cathodes.

A valve metal which has the tendency to form such a natural oxide coating 82, i.e., an oxide coating formed spontaneously upon the exposure of the valve metal to air or oxygen, is, of course, desirable. However, thermally or electrically formed oxides may perform the same functions as naturally formed oxide, therefore a valve metal may be anodized prior to its use as a cathode to build up the natural oxide layer or to form an oxide layer and thereby improve the working capabilities of the valve metal cathode. It has been found, in the case of tantalum that the tantalum cathode can have an oxide layer equivalent to 100-volt oxide film [10–20 A. volt] whereafter its contact efficiency starts to decrease, when employed with a standard copper plating bath.

With reference now to FIG. 2A, there is shown a printed circuit board 70. The board 70 comprises a dielectric substrate material 71 selected from those dielectric materials well known and used in the art. On the substrate 71, in discrete regions, are thin metallic conductive patterns 72, e.g., copper, formed thereon through standard masking and electroless plating or evaporative techniques well known in the art or through the method disclosed in the application of M. A. De Angelo et al., Ser. No. 719,-976, filed Apr. 9, 1968 and now Pat. No. 3,562,005, and assigned to the assignee hereof. Connecting discrete patterns 82 on opposed sides of substrate 71 may be one or a plurality of through-holes 73.

To build up the discrete metallic patterns 72 on substrate 71, the discrete patterns 72 are destined to be subjected to an electroplating treatment. An apparatus similar to that of FIG. 1 is selected and comprises a suitable chemically inert, insulative container 74. A suitable container 74 is one which will not react with the electroplating bath reagents destined to be contained therein. Contained within container 74 is a metal electroplating solution 76 such as, for example, a standard copper acid sulfate, acid fluoroborate, alkaline cyanide or alkaline Rochelle cyanide solution.

It should again be noted that the electroplating solution selected depends upon the metal desired to be plated out, the compatibility of the plating solution with the metallic patterns 72 and the compatibility of the plating solution with the cathode. The above requirements are again those which are well known or can be easily ascertained through experimentation by those skilled in the electrochemical art.

Housed within container 74 is a valve metal cathode 77, which may be supported upon an inert pedestal 78, and which is connected by a suitable means 75 to the negative pole of a voltage source 80, e.g., a battery.

Immersed in solution 76 is a suitable anode 79, e.g., a copper anode, which is connected by a suitable means 81 to the positive pole of the voltage source 80.

The printed circuit 70 is immersed in the plating solution 76 and lowered therein until the discrete patterns or regions 72 come to rest in contact with the valve metal cathode 77, e.g., tantalum. A sufficient current density is maintained within solution 76 whereby the metal, e.g., copper, is selectively electroplated only upon the discrete patterns 72 and not upon the valve metal cathode 77. However, since the top conductive patterns 72A are exposed to the majority or mass of the plating solution 76 and the current density maintained therein, plating occurs selectively or preferentially on the top patterns 72A as indicated in FIG. 2A. After the requisite thickness of electroplated metal is obtained on regions 72A, the printed circuit 70, may be rotated so that the freshly plated patterns 72A, are now in direct contact with cathode 77 as shown in FIG. 2B. The electroplating is then continued until an equal metal build-up or thickness is achieved on the newly exposed patterns 72.

It is of course understood that there may be discrete patterns on only one side of the substrate 71 which may be built up through contact between the metal coated walls of the through-holes 73 and the cathode 77. It is also to be noted again that when a tantalum cathode is employed in the electrodeposition of copper, it has been found that the maximum current density which can be employed prior to breakdown of the semi-passive tantalum cathode is 250 amps/ft.$^2$ of the surface area of the pattern being plated upon.

Figure 3:
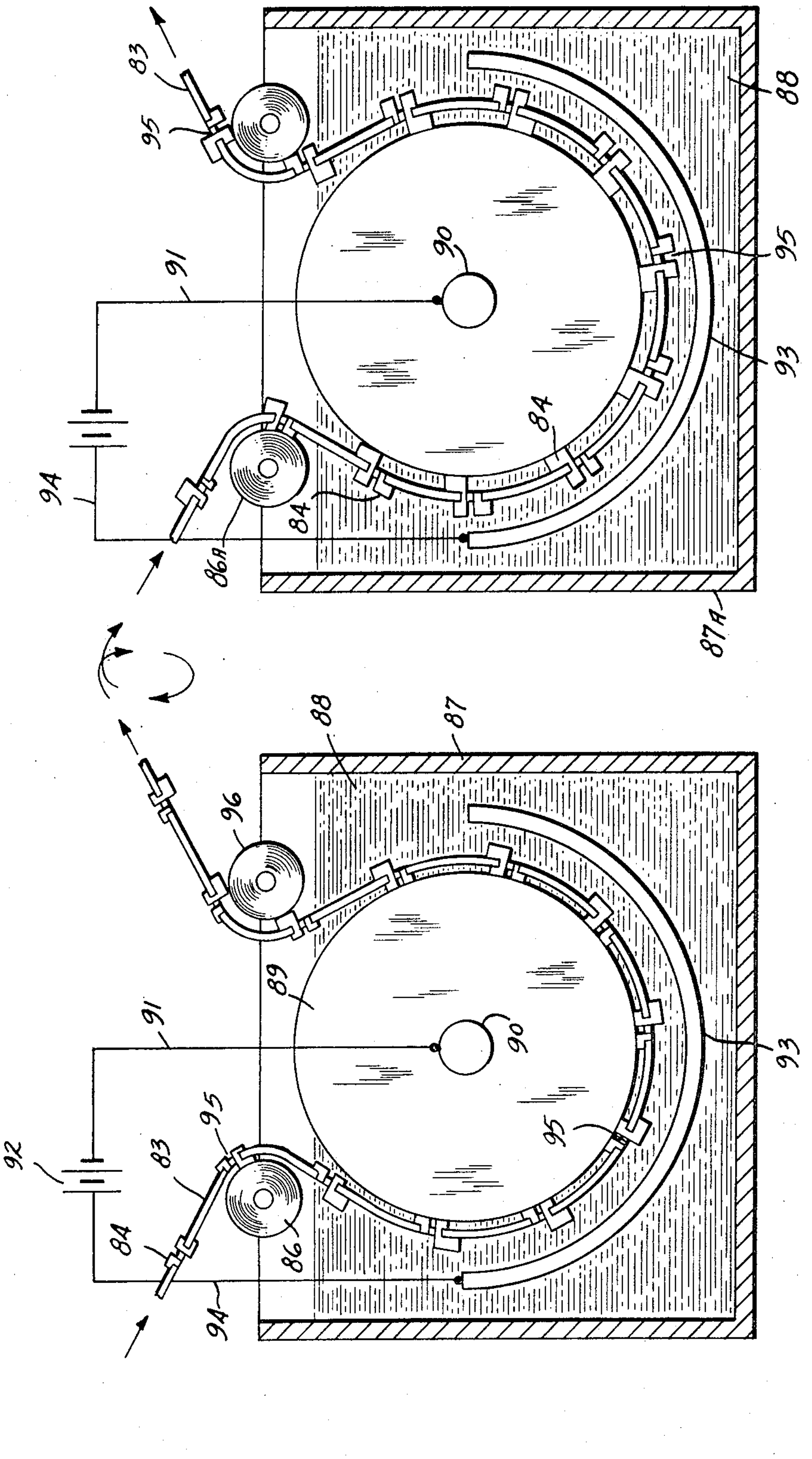
FIG. 3 is a cross-sectional view of a first alternative embodiment of a general plating apparatus, employing a valve metal roller as a cathode in an electroplating bath, having incorporated therein the embodiment of the inventive method of FIG. 1.

Referring to FIG. 3, there is shown an alternative embodiment of the present invention. A continuous web or flexible printed circuit 83 having discrete thin conductive portions 84 thereupon, e.g., copper, fabricated employing standard techniques known in the art, is fed around a loading roller 86, into a first tank or container 87. Both the roller 86 and container 87 are fabricated from chemically inert, insulative material, e.g., glass or plastic. Contained within the container 87 is a standard metal plating solution 88, e.g., copper plating solutions such as acid sulfate, acid fluoroborate, alkaline cyanide or alkaline Rochelle solution. Housed within the container 87 is a drum or roller 89 fabricated of a valve metal. To a valve metal axle 90, upon which roller 89 rotates is affixed a connecting means 91 which leads to the negative side of a voltage source 92, e.g., a battery, whereby roller 89 acts as a cathode. Immersed in the plating solution 88 is a suitable anode 93, e.g., a copper anode, which is attached by suitable means 94 to the positive pole of the voltage source 92.

In operation, the web or flexible printed circuit 83 having discrete thin conductive regions 84 on both sides, interconnected by means of through-holes 95, is fed from inert loading roller 86 to the cathodic roller 89 which intimately contacts the discrete portions 84 on the underside of web 83. A sufficient current density is maintained within solution 88 whereby metallic plating occurs preferentially, due to exposure restrictions, upon the discrete patterns 84 on the top side of web 83, rather than on the patterns 84 in contact with roller 89. Again, it should be pointed out that since there is no metallic electrodeposition upon the valve metal cathode i.e., roller 89, there is no chance of plugging through-holes 95 thereby leading to metal plating discontinuities.

The web 83 is fed into and out of the plating solution 88, contained within container 87, at a rate which will give the desired plating build-up on the discrete portions 84 not in direct contact with roller 89. The web 83 is fed around a second inert loading roller 96 which directs the electroplated web 83 out of the first container 87 whereupon the flexible web is twisted, through use of any standard means (not shown), so that the electroplated discrete portions 84 on the top surface of the web 83 are now in contact with a third inert loading roller 86A. The web 83 is then fed from roller 86A into a second container 87A housing therein the identical plating solution 88, cathodic roller 89, and anode 93 of container 87. Sufficient current is maintained within solution 88 contained within container 87A whereby metallic plating occurs, again preferentially, on the patterns 84 which were previously on the underside of web 83 but which are now fully exposed to solution 88 and the current density maintained therein. The web 83 is passed through solution 88 and out of container 87A at a rate which will give the desired build-up or thickness in the previously underplated regions 84.

Figures 4, 5, 6:
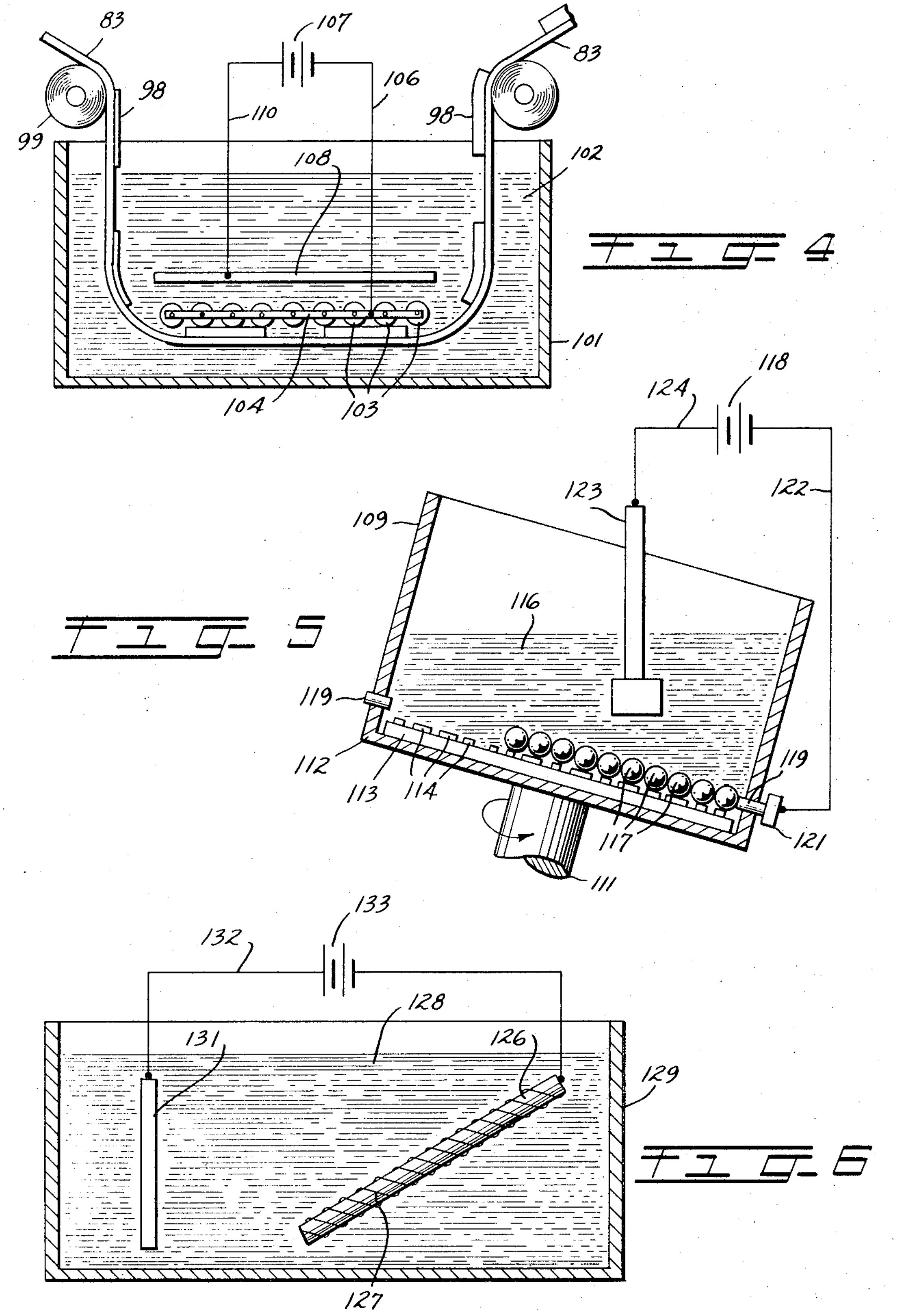
FIG. 4 is a cross-sectional view of a second alternative embodiment of a general plating apparatus, employing a plurality of valve metal rollers as a cathode in an electroplating bath, having incorporated therein the embodiment of the inventive method of FIG. 1.
FIG. 5 is a cross-sectional view of a typical barrel plating apparatus having incorporated therein the embodiment of the inventive method of FIG. 1.
FIG. 6 is a cross-sectional view of an electrolytic plating bath, containing a valve metal cathode situated therein to simulate a Hull cell, having incorporated therein the inventive method of FIG. 1.

Referring to FIG. 4, there is shown another typical plating process which has incorporated therein the embodiment of the present invention. A continuous web or flexible printed circuit 97 having discrete thin conductive portions 98 thereupon, e.g., copper, fabricated employing standard techniques known in the art, is fed around an electrically insulated and chemically inert loading roller 99 into an electrically insulative and chemically inert tank or container 101, i.e., inert to the electroplating solution destined to be housed therein. Contained within the container 101 is a standard metal plating solution 102, e.g., the copper plating solutions mentioned previously. Housed within the container 101 is a series or plurality of rollers 103. The rollers 103 are fabricated from one of the valve metals, e.g., tantalum, niobium, etc. Affixed to the plurality of rollers 103 is a valve metal contact bar 104 which is connected by means 106 to the negative pole of a voltage source 107, e.g., a battery. Immersed in the plating solution 102 is a suitable anode 108, e.g., a copper anode, which is attached by suitable means 110 to the positive pole of the constant voltage source 107.

In operation, the web or flexible printed circuit 97, having discrete thin conductive regions 98 on one side of the film 97 is fed from inert roller 99 to the negatively charged valve metal rollers 103, whereby contact in maintained between the cathodic rollers 103 and all of the discrete portions 98. A sufficient current density is maintained within solution 102 whereby metallic plating occurs upon the discrete patterns 98 but not on the rollers 103. The web 97 is fed into and out of the plating solution 102 at a rate which will give portions 98 the desired metal plating buildup. Again, it should be pointed out that the use of valve metal cathode rollers prevents metallic deposition thereupon which in turn could lead to metal build-up discontinuities.

FIG. 5 illustrates an adaptation of a typical barrel plating apparatus which has incorporated therein the embodiment of the present invention. A hollow cylindrical container 109, which is inert to the electroplating solutions destined to be housed therein and which is of electrically insulating material, is axially mounted on a rotatable shaft 111 and is inclined to the vertical. On the base 112 of the container 109 is placed an insulating circuit board 113 having discrete conductive regions or patterns 114. A standard metal plating solution 116 is housed in the container 109 and covers the board 113. Separate electrically conductive spheres or bodies 117 fabricated from the valve metals group, e.g., tantalum, niobium, etc. lie on the upper surface of the conductive portions 114 in intimate contact with one another. The conductive spheres 117 are agitated by rotation of the container 109 so that they move over the discrete conductive portions 114. Electrical connections from the negative terminal of a voltage supply 118, e.g., a battery, are made to the bodies 117 by means of metal studs 119—119. The studs 119—119 are situated in the wall of the container 109 and their outer surfaces make contact with an external rubbing contact 121 which is connected by suitable means 122 to the negative terminal of the voltage supply 118. Immersed in the plating solution 116 is a suitable anode 123, e.g., a copper anode, which is attached by suitable means 124 to the positive pole of the voltage source 118.

In operation, a sufficient current density is maintained within solution 116 to electroplate a metal, e.g., copper, onto the discrete portions 114. There is no electroplating upon the valve metal cathodes, i.e., the spheres, and therefore there is no metal flaking or pulverization which could lead to plating build-up discontinuities.

EXAMPLE I

Referring to FIG. 5, a cathode 126 was selected which comprised tantalum (99.9%). The tantalum cathode 126 was chemically polished with a cleaning solution comprising two parts by volume $HNO_3$, two parts by volume $H_2SO_4$ and one part by volume HF. A 0.020 inch diameter copper wire 127 was wound around the polished tantalum cathode 126, which had an oxide layer thereof thereon. The wire was wound in intimate contact with the cathode 126. The wire 127 was spaced 0.125 inch between windings and the total length of the copper wire 127 was 105 inches.

A plating solution 128, commercially obtained and consisting of 50% by weight, $Cu(BF_4)_2$, 5% by weight borofluoric acid, and 50% by weight of deionized water was placed in a suitable polytetrafluorethylene container 129. A copper anode 131 was selected and immersed in the plating solution 128 and attached by suitable means 132 to the positive pole of a battery 133. The tantalum cathode 126 with the wire 127 wound therearound was immersed in the solution 128 and maintained therein so as to form a simulated Hull cell, i.e., a cell wherein a wide current density range is obtained by the geometric arrangement of the cathode.

The temperature of the solution 128 was maintained at 31° C. and a constant current of 5 amps was passed into the solution 128 for a time period of 15 minutes. Copper metal was deposited only upon the copper wire 127 in contact with the tantalum cathode 126. There was no deposition upon the tantalum cathode 126 itself adjacent to areas of the wire 127 having a current density of 250 amps per square foot.

EXAMPLE II

The apparatus and procedure of Example I was repeated except that the cathode 126 comprised niobium (99.9%) having an oxide layer thereof thereon and the current passed into the solution was 0.42 amp. Also the total length of the copper wire 127 was 12 inches.

Copper metal was deposited only upon the copper wire 127 in contact with the niobium cathode 126. There was no deposition upon the niobium cathode 126 itself adjacent to areas of the wire 127 having a current density of 200 amps per square foot.

EXAMPLE III

The apparatus and procedure of Example I was repeated except that the cathode 126 comprised molybdenum (99.5%) having an oxide layer thereof thereon and the current passed into the solution was 0.171 amp. Also the total length of the copper wire 127 was 12 inches. Copper metal was deposited only upon the copper wire 127 in contact with the molybdenum cathode 126. There was no deposition upon the molybdenum cathode 126 itself adjacent to areas of the wire 127 having a current density of 80 amps per square foot.

EXAMPLE IV

The apparatus and procedure of Example I was repeated except that the cathode 126 comprised tungsten (99.5%) having an oxide layer thereof thereon and the current passed into the solution was 0.085 amp. Also the total length of the copper wire was 7 inches. Copper metal was deposited only upon the copper wire 127 in contact with the niobium cathode 126. There was no deposition upon the niobium cathode 126 itself adjacent to areas of the wire 127 having a current density of 68 amps per square foot.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method of electrodepositing a metal coating on at least one discrete conductive portion, which comprises:

(a) immersing the at least one discrete portion in a suitable electrolytic plating bath;

(b) immersing a suitable anode in said bath;

(c) contacting the at least one discrete portion with a cathode comprising a valve metal, selected from the group consisting of tantalum, niobium, molybdenum and tungsten, said valve metal cathode being capable of conducting electricity without being plated thereupon; and (d) maintaining a current density within said bath ranging (1) up to 250 amps/ft.$^2$ when said cathode comprises tantalum, (2) up to 200 amps/ft.$^2$ when said base comprises niobium, (3) up to 80 amps/ft.$^2$ when said base comprises molybdenum, and (4) up to 68 amps/ft.$^2$ when said base comprises tungsten to plate only the at least one discrete conductive portion.

2. The method as defined in claim 1 wherein said valve metal has an oxide thereof on a surface.

3. The method as defined in claim 1 wherein:
said valve metal comprises niobium.

4. The method as defined in claim 1 wherein said valve metal has been partially anodized.

5. The method as defined in claim 4 wherein said partially anodized valve metal comprises niobium.

6. The method as defined in claim 4 wherein said partially anodized valve metal is tantalum.

7. The method as defined in claim 6 wherein said partially anodized tantalum is anodized to yield a maximum 100 volt oxide film.

8. The method as defined in claim 1 wherein said cathode comprises a combination of metals, a constituent of which is selected from the valve metals group.

9. The method as defined in claim 8 wherein said valve metals group constituent has an oxide layer on a surface.

10. The method as defined in claim 8 wherein said valve metals group constituent is a major constituent of said combination.

11. The method as defined in claim 1 wherein the discrete conductive portions are secured to an insulative support.

12. The method as defined in claim 7 wherein said cathode is polished.

13. In an improved method of fabricating printed circuits bearing discrete thin film conductive patterns upon an insulative substrate member, which comprises the steps of (a) delineating desired discrete patterns on a substrate member; (b) depositing a conductive film upon said discrete patterns; and (c) increasing the thickness of said conductive film by electroplating techniques, wherein the improvement comprises:

contacting all of said discrete conductive patterns with a cathode comprising a valve metal, selected from the group consisting of tantalum, niobium, molybdenum and tungsten, which conducts but is not electroplated thereupon; and maintaining a current density within an electroplating bath ranging (1) up to 250 amps/ft.$^2$ when said cathode comprises tantalum, (2) up to 200 amps/ft.$^2$ when said cathode comprises niobium, (3) up to 80 amps/ft.$^2$ when said cathode comprises molybdenum and (4) up to 68 amps/ft.$^2$ when said cathode comprises tungsten to electroplate only upon said discrete conductive patterns.

14. The method as defined in claim 13 wherein:
said valve metal comprises niobium.

15. The method as defined in claim 13 wherein said valve metal has an oxide thereof on a surface.

16. The method as defined in claim 13 wherein said valve metal has been partially anodized.

17. The method as defined in claim 16 wherein said partially anodized valve metal comprises partially anodized niobium.

18. The method as defined in claim 16 wherein said partially anodized valve metal comprises partially anodized tantalum.

19. The method as defined in claim 18 wherein said partially anodized tantalum is anodized to yield a maximum 100 volt oxide film.

20. The method as defined in claim 13 wherein said cathode comprises a combination of metals, a constituent of which is selected from the valve metals group.

21. The method as defined in claim 20 wherein said valve metals group constituent has an oxide layer thereof on a surface.

22. The method as defined in claim 20 wherein said valve metals group constituent is a major constituent of said combination.

23. The method as defined in claim 13 wherein said cathode is polished.

24. A method of electrodepositing a copper coating on discrete conductive portions, which comprises:

(a) immersing the discrete portions in a suitable electrolytic plating bath containing copper ions;

(b) immersing a suitable anode in said bath;

(c) contacting the discrete portions with a cathode comprising a valve metal selected from the group consisting of tantalum, niobium, molybdenum and tungsten; and (d) maintaining a sufficient current density within said bath ranging (1) up to 250 amps/ft.$^2$ when said cathode comprises tantalum, (2) up to 200 amps./ft.$^2$ when said base comprises niobium, (3) up to 80 amps/ft.$^2$ when said base comprises molybdenum and (4) up to 68 amps/ft.$^2$ when said base comprises tungsten whereby only the discrete conductive portions are plated with copper.

25. The method as defined in claim 24 wherein said valve metal comprises niobium.

26. The method as defined in claim 24 wherein said valve metal comprises tantalum.

27. The method as defined in claim 26 wherein said tantalum has an oxide coating thereof on a surface.

28. The method as defined in claim 26 wherein said tantalum cathode is partially anodized.

29. The method as defined in claim 28 wherein said partially anodized tantalum cathode has a maximum oxide layer of 100 volt oxide film.

30. The method as defined in claim 24 wherein said valve metal cathode is polished.

31. A method of electrodepositing a metal coating on at least one discrete conductive portion, which comprises:

(a) immersing the at least one discrete portion in a suitable electrolytic plating bath;

(b) immersing a suitable anode in said bath;

(c) contacting the at least one discrete portion with a cathode comprising tantalum, said tantalum cathode being capable of conducting electricity without being plated thereupon; and (d) maintaining a sufficient current density within said bath ranging up to 250 amps/ft.$^2$ to plate only the at least one discrete conductive portion.

32. A method of electrodepositing a metal coating on at least one discrete conductive portion, which comprises:

(a) immersing the at least one discrete portion in a suitable electrolytic plating bath;

(b) immersing a suitable anode in said bath;

(c) contacting the at least one discrete portion with a cathode comprising niobium, said niobium cathode being capable of conducting electricity without being plated thereupon; and (d) maintaining a sufficient current density within said bath ranging up to 200 amps/ft.$^2$ to plate only the at least one discrete conductive portion.

33. A method of electrodepositing a metal coating on at least one discrete conductive portion, which comprises:

(a) immering the at least one discrete portion in a suitable electrolytic plating bath;

(b) immersing a suitable anode in said bath;

(c) contacting the at least one discrete portion with a cathode comprising molybdenum, said molybdenum cathode being capable of conducting electricity without being plated thereupon; and (d) maintaining a sufficient current density within said bath ranging up to 80 amps/ft.$^2$ to plate only the at least one discrete conductive portion.

34. A method of electrodepositing a metal coating on at least one discrete conductive portion, which comprises:
(a) immersing the at least one discrete portion in a suitable electrolytic plating bath;
(b) immersing a suitable anode in said bath;
(c) contacting the at least one discrete portion with a cathode comprising tungsten, said tungsten cathode being capable of conducting electricity without being plated thereupon; and
(d) maintaining a sufficient current density within said bath ranging up to 68 amps/ft.$^2$ to plate only the at least one discrete conductive portion.

References Cited

UNITED STATES PATENTS

| | | | |
|---|---|---|---|
| 3,261,769 | 7/1966 | Coe et al. | 204—15 |
| 3,429,786 | 2/1969 | Kubik | 204—297 R |
| 2,708,181 | 5/1955 | Holmes | 204—28 |

FOREIGN PATENTS

| | | |
|---|---|---|
| 897,416 | 5/1944 | France. |

JOHN H. MACK, Primary Examiner

T. TUFARIELLO, Assistant Examiner

U.S. Cl. X.R.

204—28, 290 F, 297 R

L-566-PT
(6-69)

UNITED STATES PATENT OFFICE
CERTIFICATE OF CORRECTION

Patent No. 3,729,389 Dated April 24, 1973

Inventor(s) MICHAEL A. DE ANGELO and DONALD J. SHARP

It is certified that error appears in the above-identified patent and that said Letters Patent are hereby corrected as shown below:

In the specification, Column 8, line 55, "niobium" should read --tungsten--; line 56, "niobium" should read --tungsten--.

Signed and sealed this 5th day of February 1974.

(SEAL)
Attest:

EDWARD M.FLETCHER,JR.
Attesting Officer

RENE D. TEGTMEYER
Acting Commissioner of Patents